United States Patent

(12) United States Patent
Ogitsu

(10) Patent No.: US 10,008,402 B1
(45) Date of Patent: Jun. 26, 2018

(54) VERTICAL WAFER BOAT

(71) Applicant: COORSTEK KK, Shinagawa-ku, Tokyo (JP)

(72) Inventor: Takeshi Ogitsu, Yamagata (JP)

(73) Assignee: COORSTEK KK, Shinagawa-Ku, Tokyo (JP)

(*) Notice: Subject to any disclaimer, the term of this patent is extended or adjusted under 35 U.S.C. 154(b) by 0 days. days.

(21) Appl. No.: 15/897,006

(22) Filed: Feb. 14, 2018

(30) Foreign Application Priority Data

Feb. 21, 2017 (JP) .................. 2017-030224

(51) Int. Cl.
H01L 21/00 (2006.01)
H01L 21/673 (2006.01)
H01L 21/687 (2006.01)

(52) U.S. Cl.
CPC .... H01L 21/67309 (2013.01); H01L 21/6875 (2013.01); H01L 21/68735 (2013.01)

(58) Field of Classification Search
CPC ........... H01L 21/68735; H01L 21/6875; H01L 21/67; H01L 21/67309; H01L 21/67303; H01L 21/67306; C30B 31/14; C23C 16/4583; Y10S 414/138; Y10S 414/135
USPC ........................ 211/41.18; 432/258
See application file for complete search history.

(56) References Cited

U.S. PATENT DOCUMENTS

| 5,492,229 | A | * | 2/1996 | Tanaka | ............... | C30B 31/14 206/454 |
| 5,534,074 | A | * | 7/1996 | Koons | ................ | C23C 16/4583 118/500 |
| 5,586,880 | A | * | 12/1996 | Ohsawa | ................. | C30B 25/12 432/241 |
| 5,865,321 | A | * | 2/1999 | Tomanovich | ..... | H01L 21/67309 206/454 |
| 5,882,418 | A | * | 3/1999 | Fujii | ................... | C23C 16/4404 118/728 |
| 5,931,666 | A | * | 8/1999 | Hengst | .............. | H01L 21/67309 206/454 |
| 6,033,215 | A | * | 3/2000 | Ohsawa | ................. | C30B 25/12 211/41.18 |
| 6,056,123 | A | * | 5/2000 | Niemirowski | ....... | B65D 25/107 118/500 |

(Continued)

FOREIGN PATENT DOCUMENTS

EP 2200072 A1 6/2010
JP 2009-99576 A 5/2009

Primary Examiner — Patrick D Hawn
(74) Attorney, Agent, or Firm — Procopio, Cory, Hargreaves & Savitch LLP

(57) ABSTRACT

A vertical wafer boat includes a top plate, a bottom plate, three support posts, and wafer support parts. The support posts include a first and a second support posts arranged in right and left sides of a starting end side of a wafer inserting direction, and a third support post arranged in a center of a terminal end side of the wafer inserting direction. The wafer support parts include a first, second and third wafer support parts protruding in the horizontal direction from side surfaces of the first, second and third support posts, respectively. A total of horizontal sectional areas of the first wafer support part and the first support post, or the second wafer support part and the second support post, and a total of horizontal sectional areas of the third wafer support part and the third support post have a specific relationship.

4 Claims, 8 Drawing Sheets

(56) References Cited

U.S. PATENT DOCUMENTS

| | | | | |
|---|---|---|---|---|
| 6,099,302 A * | 8/2000 | Hong | ................ | C30B 31/14 211/41.18 |
| 6,110,285 A * | 8/2000 | Kitazawa | ............ | C23C 16/4581 118/715 |
| 6,196,211 B1 * | 3/2001 | Zehavi | ............. | H01L 21/67303 125/12 |
| 6,237,979 B1 * | 5/2001 | Korn | ................ | H01L 21/67316 118/500 |
| 6,488,497 B1 * | 12/2002 | Buckley | ................ | C30B 25/12 211/41.18 |
| 6,607,381 B2 * | 8/2003 | Minanni | ................ | C30B 31/14 211/41.18 |
| 6,939,132 B2 * | 9/2005 | Loo | ................ | H01L 21/67309 206/711 |
| 7,033,168 B1 * | 4/2006 | Gupta | ................ | C23C 16/4583 211/41.18 |
| 7,661,544 B2 * | 2/2010 | Herzog | ............ | H01L 21/67309 211/41.18 |
| 7,736,436 B2 * | 6/2010 | Cadwell | ................ | C30B 25/12 117/200 |
| 8,042,697 B2 * | 10/2011 | Gilmore | ............ | H01L 21/67309 211/41.18 |
| 8,220,646 B2 * | 7/2012 | Gilmore | ............ | H01L 21/67309 211/41.18 |
| 9,153,466 B2 * | 10/2015 | Jdira | ................ | H01L 21/67303 211/41.18 |
| 2001/0013340 A1 * | 8/2001 | Zehavi | ............. | H01L 21/67303 125/35 |
| 2002/0113027 A1 * | 8/2002 | Minami | ............ | H01L 21/67109 211/41.18 |
| 2002/0172908 A1 * | 11/2002 | Minanni | ................ | C30B 31/14 432/253 |
| 2003/0024888 A1 * | 2/2003 | Payne | ............. | H01L 21/67303 211/41.18 |
| 2005/0145584 A1 * | 7/2005 | Buckley | ............ | H01L 21/67303 211/41.18 |
| 2007/0006803 A1 * | 1/2007 | Cadwell | ................ | C30B 25/12 117/200 |
| 2008/0000851 A1 * | 1/2008 | Pickering | ............ | H01L 21/67303 211/41.18 |
| 2013/0284683 A1 * | 10/2013 | Jdira | ................ | H01L 21/67309 211/41.18 |
| 2018/0019144 A1 * | 1/2018 | Ogitsu | ............. | H01L 21/67309 |

* cited by examiner

US 10,008,402 B1

VERTICAL WAFER BOAT

TECHNICAL FIELD

The present invention relates to a vertical wafer boat and particularly relates to a vertical wafer boat that holds silicon wafers used for manufacturing a semiconductor device in a heat treatment process.

BACKGROUND ART

A heat treatment is applied to a wafer used for manufacturing a semiconductor device. The heat treatment is carried out by placing a vertical wafer boat on which many wafers are mounted in a heat treatment device.

In recent years, the wafer has an increased diameter, so that the wafer is liable to slip. Accordingly, a countermeasure for that is an important problem. As the countermeasure to suppress the slip, for instance, Patent Literature 1 proposes an invention in which the wafer support portion supports from the outer peripheral part of the wafer to the position of 40 to 60% of the radius thereof to minimize a deformation of the wafer and suppress the occurrence of the slip.

A vertical wafer boat disclosed in the Patent Literature 1 will be described below by referring to FIG. 8. FIG. 8 illustrates a state that the vertical wafer boat is seen through from its upper part.

A wafer boat 100 includes support members 101 and 102 in a starting end side seen from a wafer inserting direction X and a support member 103 in a terminal end side, arranged in parallel to each other in a vertical direction. These support members 101, 102 and 103 are allowed to stand upright on a disk shaped base (a bottom plate). Further, upper end parts of the support members are supported by a disk shaped upper fixing member (a top plate).

A circumscribed circle 105 shown in FIG. 8 indicates the upper fixing member (the top plate) of the wafer boat 100. Further, a symbol W shown by a dotted line indicates a mounting position (referred to as a wafer W) of a mounted on the wafer boat 100. Further, an arrow mark X shows an inserting direction of the wafer W to the wafer boat 100.

The support members 101, 102 and 103 respectively include support post parts 101b, 102b and 103b and a plurality of wafer support parts 101a, 102a and 103a respectively horizontally protruding from side surfaces of the support post parts 101b, 102b and 103b and formed to be long.

Further, the support members 101 and 102 located in the wafer insert starting end side are formed to be linearly symmetrical to each other with respect to a dashed-dotted line h that passes through an insertion center point O of the wafer W and extends in the inserting direction X of the wafer W.

Further, the support member 103 located in the wafer insert terminal end side is provided on the dashed-dotted line h that passes through the insertion center point O of the wafer W and extends in the inserting direction X of the wafer W.

Further, the support members 101 and 102 located in the wafer insert starting end side are formed substantially in bent leg shapes in horizontal sections including wafer support parts. On the other hand, the wafer support part 103a is extended substantially linearly from the support member 103.

Here, end parts of the wafer support parts 101a and 102a of the support members 101 and 102 located in the wafer insert starting end side and an end part of the support member 103 located in the wafer insert terminal end side are constituted so as to be located in positions of 40 to 60% of the radius of the wafer W from the outer peripheral part of the wafer.

According to the above-described structure, the wafer W is supported (three point support) by the wafer support parts 101a, 102a and 103a, so that a deformation of the wafer W can be suppressed. As a result, it is possible to expect that a concentration of stress to a specific position of the wafer can be mitigated and a countermeasure for reducing a slip can be made to be effective.

PRIOR ART LITERATURE

Patent Literature

[Patent Literature 1] JP-A-2009-99576

SUMMARY OF THE INVENTION

Problems that the Invention is to Solve

In the wafer boat illustrated in FIG. 8, the length of the wafer support parts 101a and 102a is different from the length of the wafer support part 103a between the support members 101 and 102 in the wafer insert starting end side and the support member 103 in the terminal end side of the wafer inserting direction.

In the case where length dimensions are different as described above, surface areas (volume) of the support members are different from each other to generate a difference in the heat quantity received during a heat treatment. Accordingly, the degrees of deformation due to a thermal expansion are different between the support members. As a result, there is a fear that an inclination may arise in the supported wafer W.

In the case where the inclination arises in the wafer W, a problem arises that a stress is concentrated on a specific part of the wafer W, so that a slip is liable to occur.

The present invention is devised by considering the above-described circumstances, and an object of the present invention is to provide a vertical wafer boat including wafer support parts of long forms in which wafers are not inclined and an occurrence of a slip can be suppressed by reducing a deformation difference between the wafer support parts due to heat.

Means for Solving the Problems

The vertical wafer boat according to the present invention which is devised in order to solve the above-described problems is a vertical wafer boat, to which a wafer is inserted in a wafer inserting direction, the vertical wafer boat including a top plate, a bottom plate, three support posts each having one end fixed to the top plate and the other end fixed to the bottom plate, and wafer support parts, in which the support posts include a first and a second support posts arranged in right and left sides of a starting end side of the wafer inserting direction, and a third support post arranged in a center of a terminal end side of the wafer inserting direction, the wafer support parts include a first, a second and a third wafer support parts protruding in the horizontal direction from side surfaces of the first, the second and the third support posts, respectively, and when a total of horizontal sectional areas of the first wafer support part and the first support post and a total of horizontal sectional areas of the second wafer support part and the second support post are denoted by Sa, and a total of horizontal sectional areas of the third wafer support part and the third support post is denoted by Sb, an absolute value of a Ratio defined by the following expression is 1% or lower:

$$\text{Ratio}(\%) = 100 \times (Sa - Sb)/(Sa + Sb).$$

The first wafer support part and the first support post preferably form a bent leg shape in a horizontal section, the second wafer support part and the second support post preferably form a bent leg shape in a horizontal section, and the third wafer support part and the third support post preferably form a tapered shape in a horizontal section having a width increasing from an end of the third wafer support part toward a side of the third support post.

Further, end parts of the first, the second and the third wafer support parts are preferably arranged to be in positions of 65% or more and 75% or less of a radius of the wafer to be supported, from a center of the wafer.

According to the above-described structure, the horizontal sectional area of the first and second wafer support parts including the support post parts is constituted to be substantially equal to the horizontal sectional area of the third wafer support part including the support post part. Thus, a heat quantity that the first and second support members including the support post parts receive during a heat treatment is substantially equal to a heat quantity that the third support member including the support post part receives during a heat treatment, so that there is no difference in deformation due to a thermal expansion. Accordingly, the wafer is held without being inclined, a stress is not concentrated on a specific part of the wafer and an occurrence of a slip can be suppressed.

Advantages of the Invention

According to the present invention, a vertical wafer boat having wafer support parts of long forms can be obtained in which wafers are not inclined and an occurrence of a slip can be suppressed by reducing a deformation difference between the wafer support parts due to heat.

Figure 1:
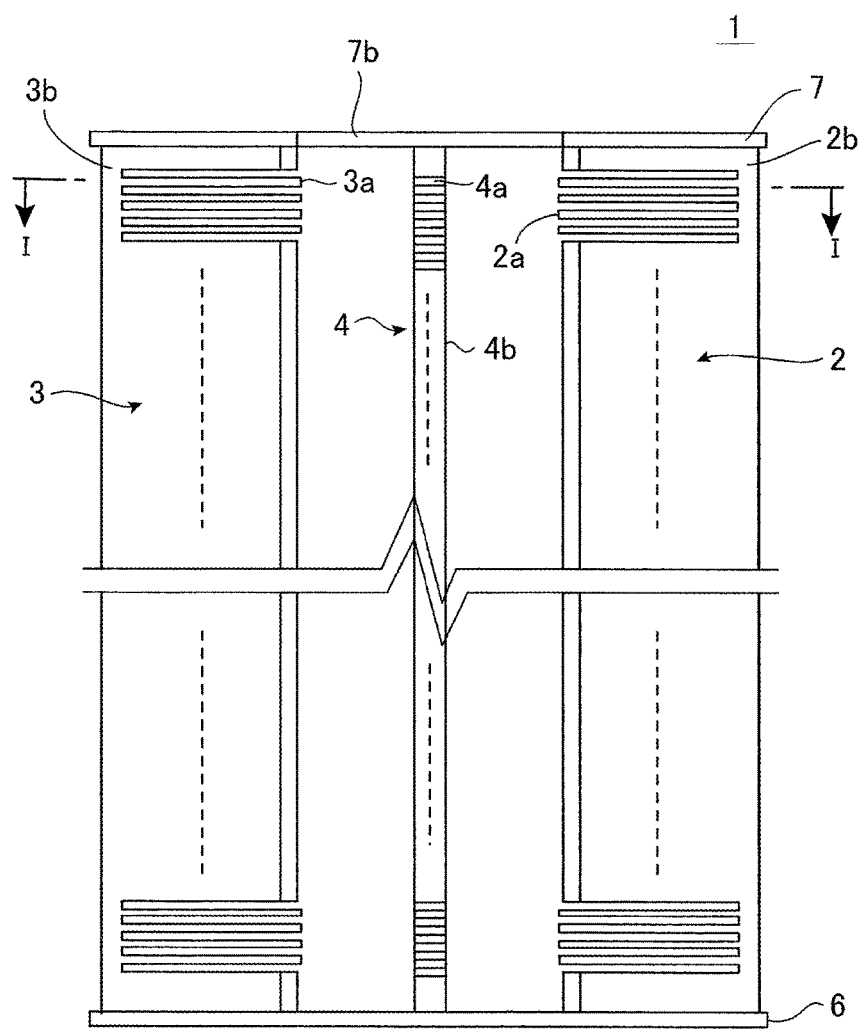
FIG. 1 is a front view of a vertical wafer boat according to a present embodiment.
Figure 5:
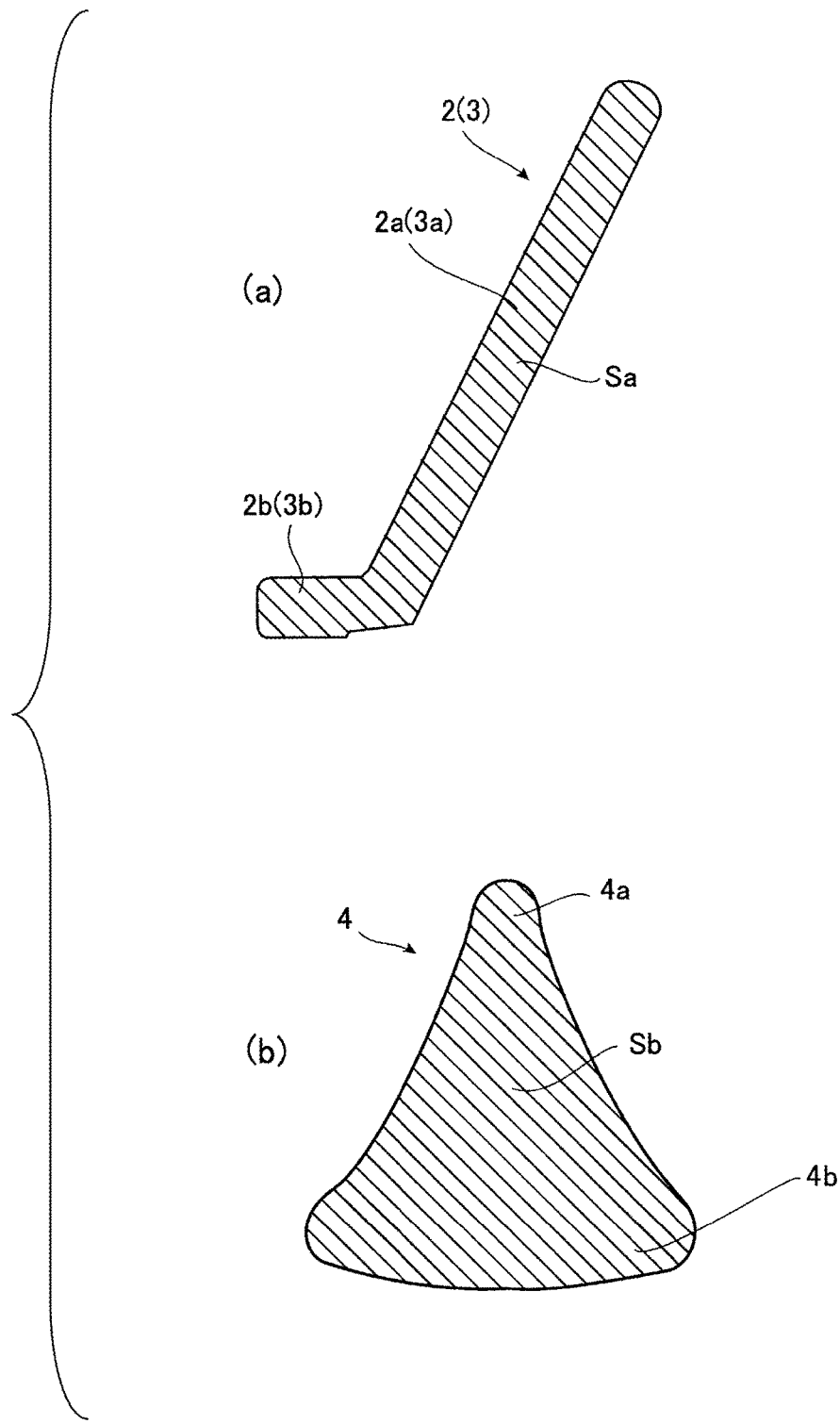

(a) and (b) of FIG. 5 are horizontal sectional views of wafer support parts including support post parts included in the vertical wafer boat of FIG. 1.

Figure 6:
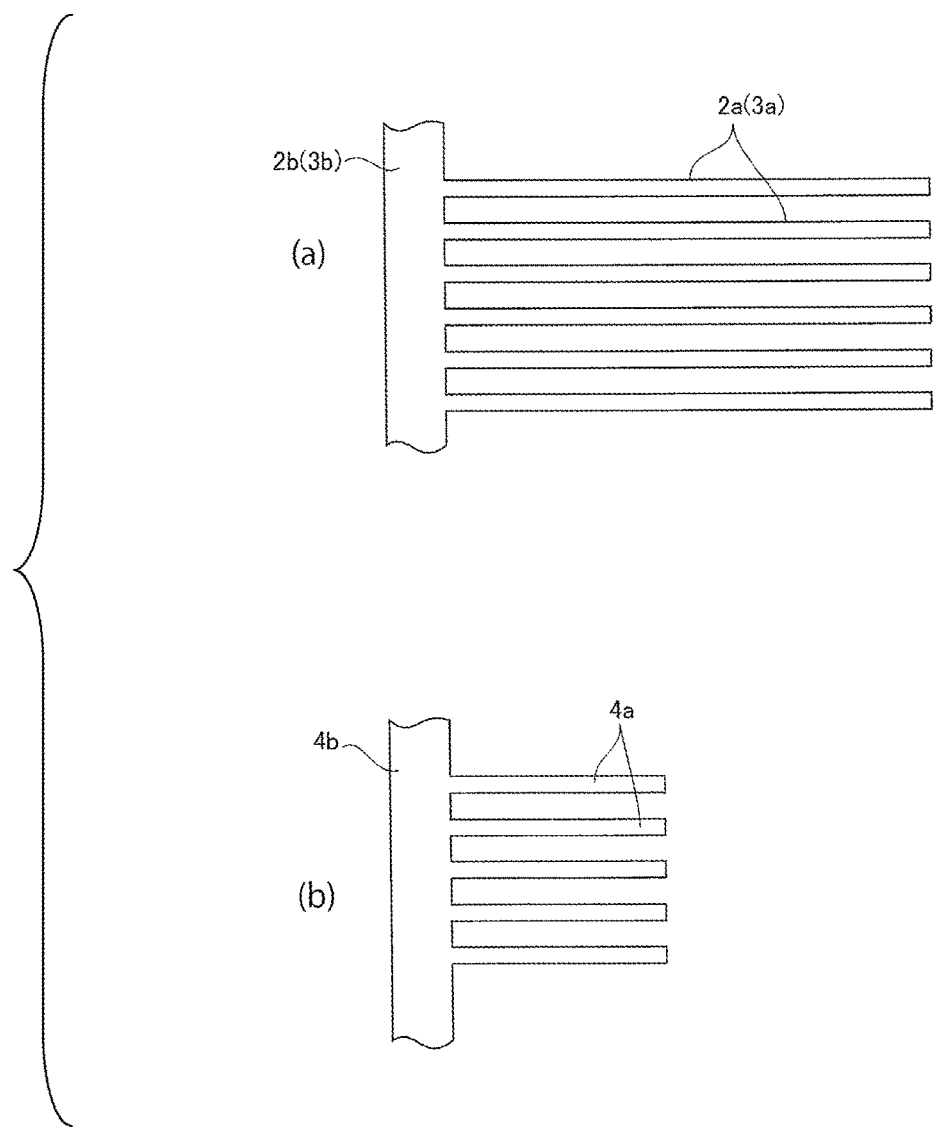

(a) and (b) of FIG. 6 are side views of the wafer support parts included in the vertical wafer boat of FIG. 1.

Figure 7:
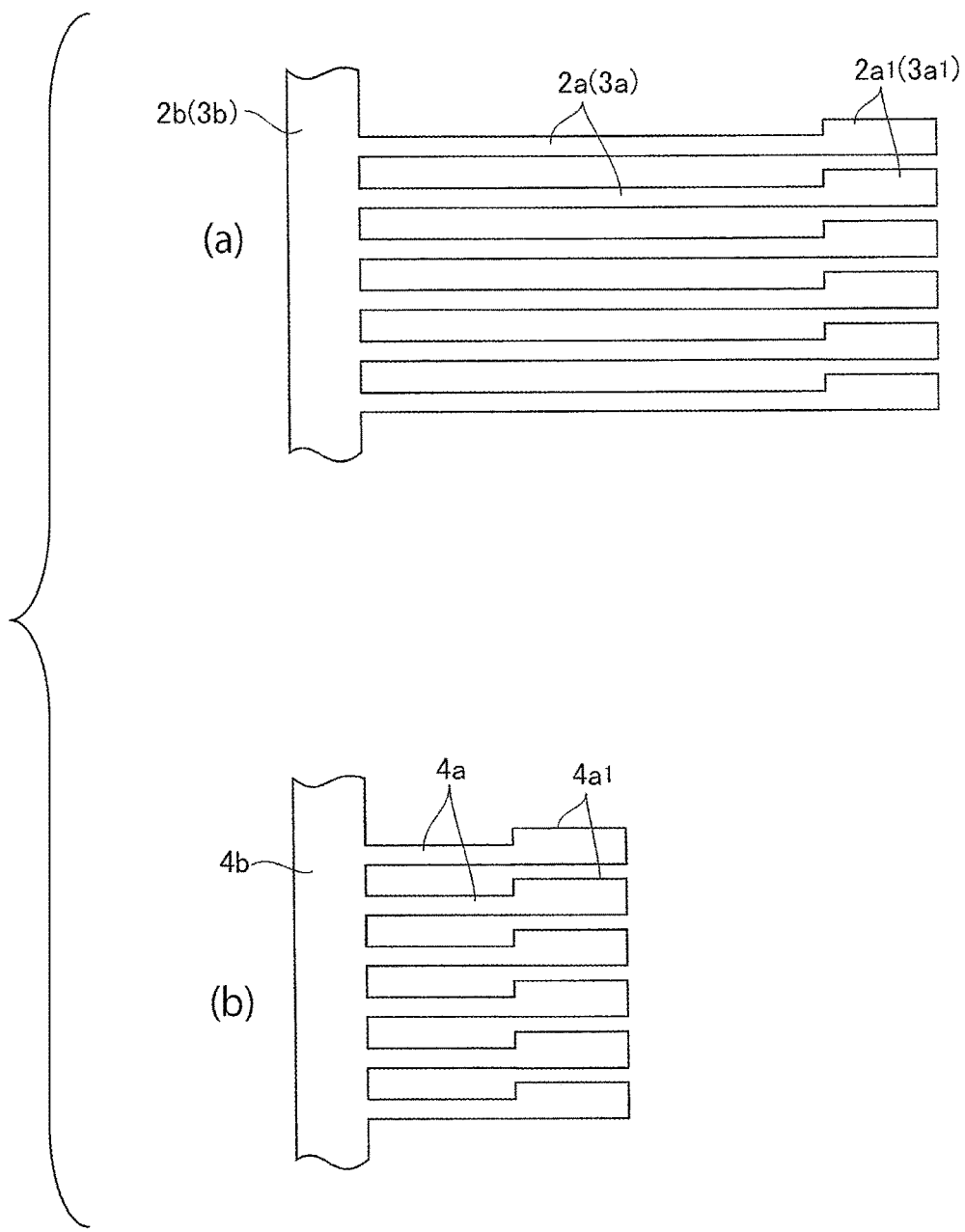

(a) and (b) of FIG. 7 are side views illustrating a modified example of the wafer support part included in the vertical wafer boat of FIG. 1.

Figure 8:
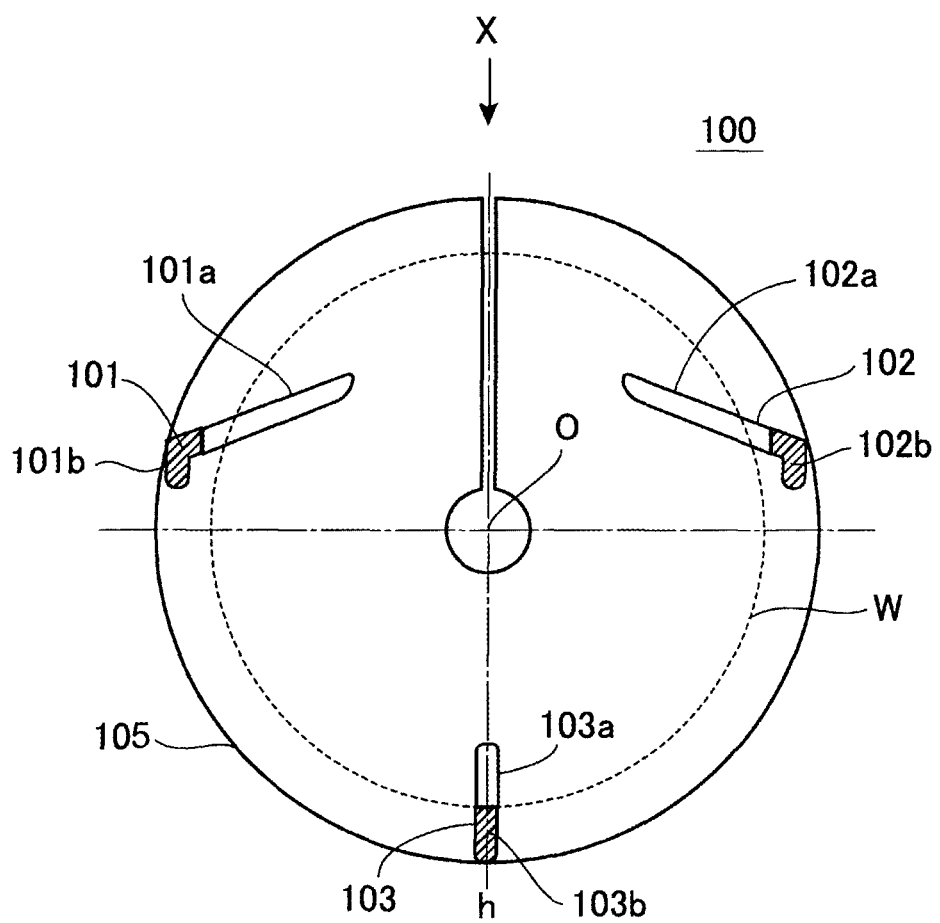

FIG. 8 is a view illustrating a state that a conventional vertical wafer boat is seen through from its upper part.

MODE FOR CARRYING OUT THE INVENTION

Figure 2:
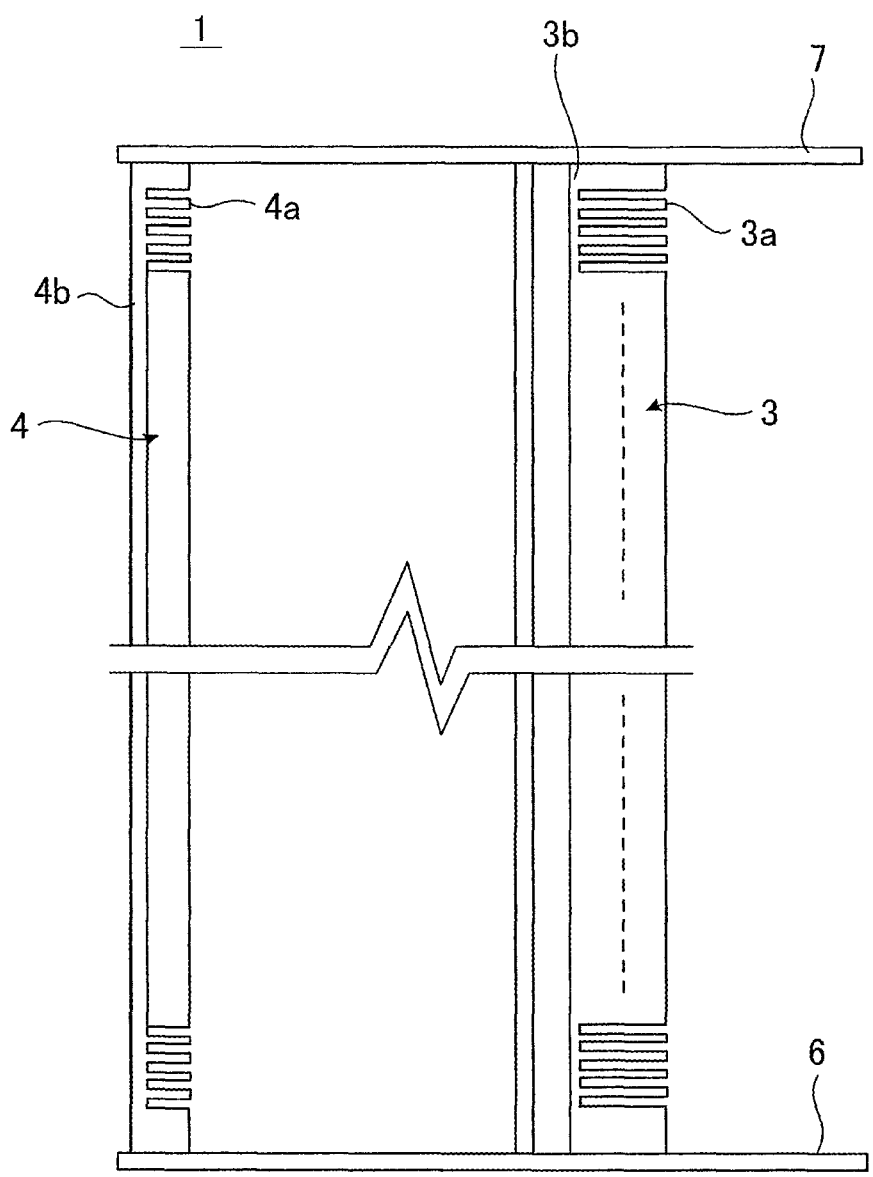
FIG. 2 is a side view of the vertical wafer boat illustrated in FIG. 1.
Figure 3:
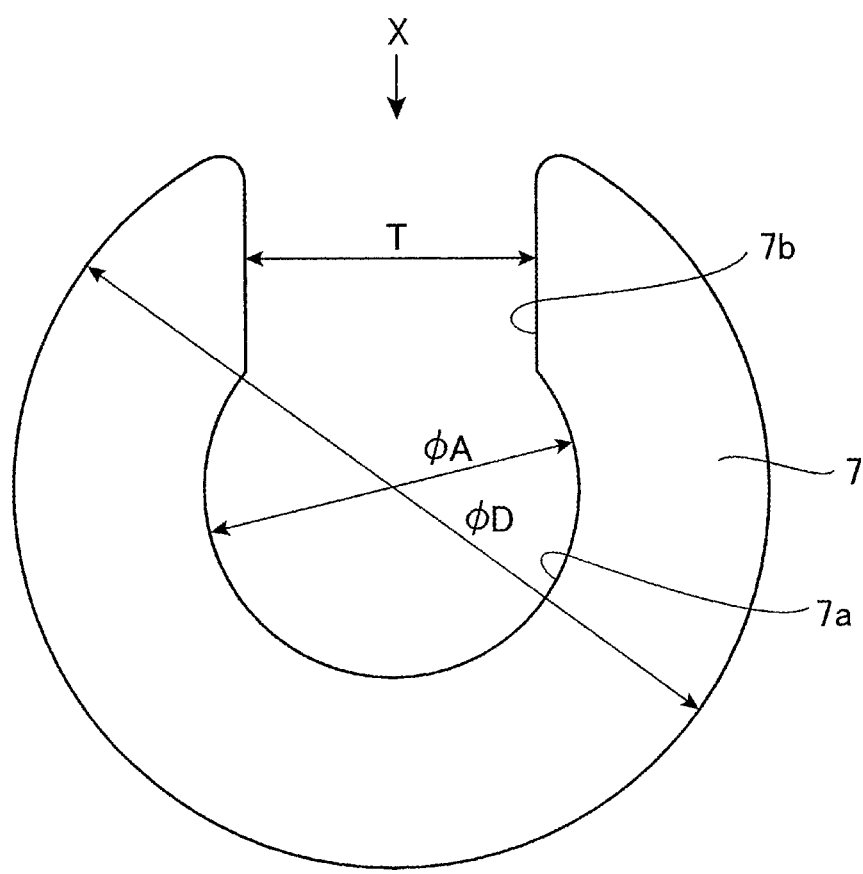
FIG. 3 is a plan view of a top plate of the vertical wafer boat illustrated in FIG. 1.
Figure 4:
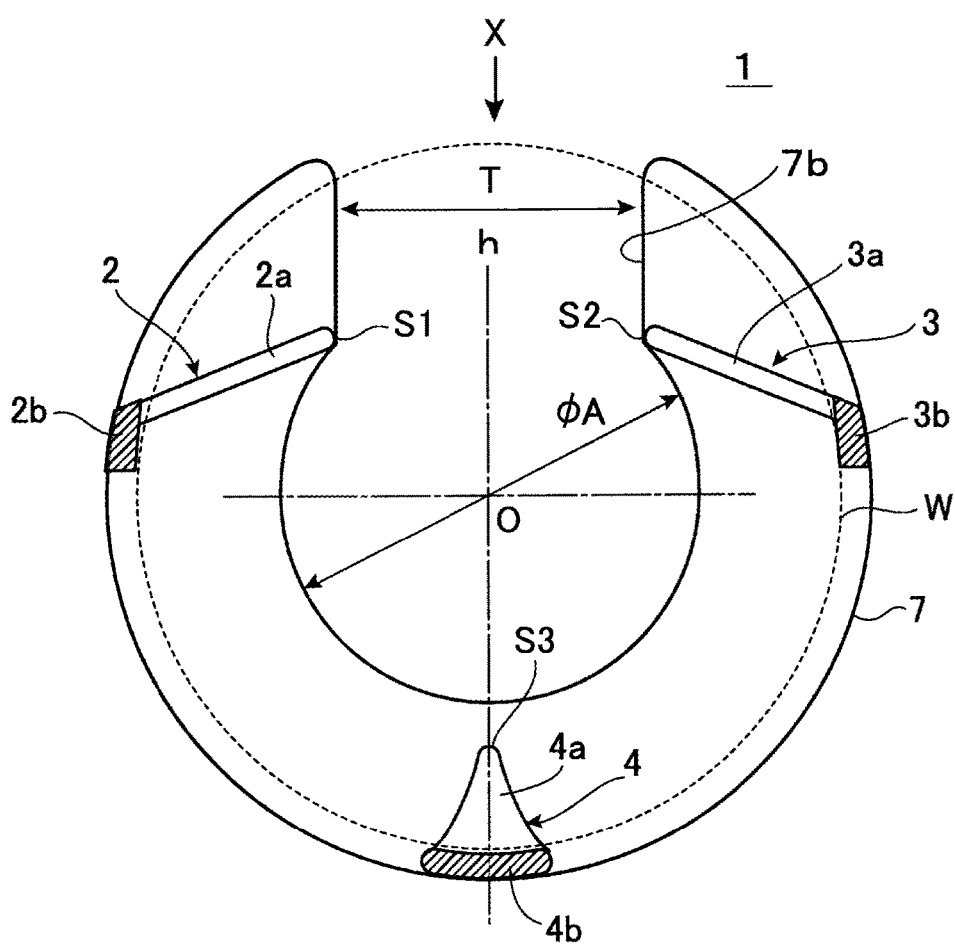
FIG. 4 is a sectional view (a plan view) taken along a line I-I of FIG. 1.

An embodiment of a vertical wafer boat according to the present invention will be described below by referring to the drawings. FIG. 1 is a front view of the vertical wafer boat according to the present embodiment. FIG. 2 is a side view of the vertical wafer boat illustrated in FIG. 1. FIG. 3 is a plan view of a top plate of the vertical wafer boat. FIG. 4 is a sectional view (a plan view) taken along a line I-I of FIG. 1.

As illustrated in FIGS. 1 and 2, the vertical wafer boat 1 includes two support members 2 and 3 arranged in a starting end side of a wafer inserting direction (referred to as a wafer insert starting end side, hereinafter) and one support member 4 arranged in a terminal end side of the wafer inserting direction (referred to as a wafer insert terminal end side, hereinafter). Lower end parts of the support members 2, 3 and 4 are allowed to stand upright on a disk shaped bottom plate 6 and upper ends of the support members are supported by a disk shaped top plate 7.

The support members 2, 3 and 4 respectively include a plurality of wafer support parts 2a, 3a and 4a to support many wafers. In the support members 2, 3 and 4 respectively, 50 to 150 wafer support parts 2a, 3a and 4a are vertically formed, for instance, at pitches of 8 mm.

As illustrated in FIG. 3, in the top plate 7, an opening part 7a is formed in a central part of the top plate 7 in order to form a main flow of gas during purification in the center of the top plate 7. The opening part 7a, in the case of being seen from an upper surface of the top plate 7, is formed with a diameter φA in such a way that end parts S1, S2 and S3 of the wafer support parts 2a, 3a and 4a do not protrude inside of the opening part 7a as illustrated in FIG. 4. This is because in the case where the end parts S1, S2 and S3 of the wafer support parts 2a, 3a and 4a protrude inside of the opening part 7a, a singular disturbance of gas is liable to arise in the central side of the wafer.

The opening part 7a is preferably a circular form having its center on the center of the top plate 7 (a center of a mounted wafer W). However, the present invention is not especially limited thereto. Other forms, for instance, polygonal forms such as a square form, a hexagonal form and an octagonal form, an elliptical form, a star type, or a gear type may be used.

Further, as for an outer form of the top plate 7, an ordinary circular form is also preferable. However, the present invention is not especially limited thereto. Other forms, for instance, polygonal forms such as a square form, a hexagonal form and an octagonal form, an elliptical form, a nearly star type, or a gear type may be used.

Further, as illustrated in FIG. 3, in an inserting side of the wafer W of the top plate 7, a slit part 7b communicating with the opening part 7a is formed. The slit part 7b is formed in such a way that a center point of the slit part 7b in a width direction is located on a dashed-dotted line h that connects an inserting direction X of the wafer W and an insertion center point O of the wafer W.

A width T of the slit part 7b of the top plate 7 preferably has a dimension of 35% or more and 45% or less of width of the top plate 7. Here, in the case where the top plate 7 has a rectangular form, the width of the top plate 7 means a length in a direction that intersects at right angles to the wafer inserting direction X. In the case where the top plate 7 has a circular form, the width of the top plate 7 means a diameter φD thereof.

As described above, the width T of the slit part 7b is 35% or more of the width of the top plate 7 because in the case of less than 35%, a sufficient quantity of supply of gas cannot be ensured through the top plate 7. On the other hand, the width T of the silt part 7b is 45% or less of the width of the top plate because in the case of the width exceeding 45%, strength of the boat is undesirably weakened.

Further, an area of the opening part 7a of the top plate 7 is more preferably formed so as to be set to 30% or more and 40% or less of an area of an upper surface of the top plate 7.

The area of the opening part is prescribed in such a way as described above, because the gas sufficiently reaches to the wafer support parts 2a, 3a and 4a provided under the top plate 7.

Specifically, in the case where the area of the opening part 7a of the top plate 7 is less than 30% of the area of the upper surface of the top plate, the gas is hardly sufficiently supplied to the lower part of the boat. Thus, there is a fear that a purification effect may be hardly satisfactorily obtained. On the other hand, in the case where the opening area exceeds 40%, a flow of the gas passing the boat from the upper part to the lower part is increased. Accordingly, the gas does not come into contact with support posts and the wafer support parts to have a state that the gas simply passes through an inner part of the boat. Thus, there is also fear that the purification effect cannot be satisfactorily obtained.

Further, the width T of the slit part 7b of the top plate 7 is more preferably the same as a space between the above-described end parts S1 and S2 of the support parts of the wafer insert starting end side.

In this case, since edge part of the slit part 7b, in the case of being seen from the upper surface of the top plate 7, is superposed on the end parts S1 and S2 of the wafer support parts 2a and 3a, the singular disturbance of the gas in the central side of the wafer which is generated due to a protrusion of the end parts S1 and S2 of the wafer support parts 2a and 3a to the inner side of the slit part 7b can be more assuredly suppressed.

Subsequently, by referring to FIG. 4 and (a) and (b) of FIG. 5, the support members 2, 3 and 4 will be more specifically described below. (a) and (b) of FIG. 5 are horizontal sectional views of the wafer support parts including support post parts included in the vertical wafer boat of FIG. 1.

In FIG. 4, symbol W shown by a dotted line designates a position of the wafer W mounted on the vertical wafer boat 1. An arrow mark X designates the inserting direction of the wafer W to the vertical wafer boat 1.

The support members 2 and 3 arranged in the wafer insert starting end side are constituted by the support post parts 2b and 3b and the plurality of wafer support parts 2a and 3a respectively formed to protrude in a horizontal direction from side surfaces of the support post parts 2b and 3b. As illustrated in (a) of FIG. 5, a horizontal section including the wafer support part is formed substantially in a bent leg shape.

As illustrated in FIG. 4, the above-described support members 2 and 3 are constituted to be linearly symmetrical with each other with respect to the dashed-dotted line h that connects the inserting direction X of the wafer W and the insertion center point O of the wafer W. The end parts S1 and S2 of the wafer support parts 2a and 3a, in the case of being seen from the upper surface, have semi-circular forms.

Further, the support member 4 arranged in the wafer insert terminal end side is constituted by the support post part 4b and the plurality of wafer support parts 4a formed to protrude in a horizontal direction from a side surface of the support post part 4b. A horizontal section of the wafer support part 4a including the support post part 4b is formed to have a tapered form (substantially triangular form) so as to be thin in an end and wider toward the support post part 4b (the wafer insert terminal end side) as illustrated in (b) of FIG. 5.

The support member 4 is located on the dashed-dotted line h that passes through the insertion center point O of the wafer W and extends in the inserting direction X of the wafer W. The wafer support part 4a of the support member 4 is extended in the horizontal direction toward the insertion center point O of the wafer W from the support post part 4b of the wafer insert terminal end side. The end part S3 of the wafer support part 4a, in the case of being seen from the upper surface, has a semi-circular form.

In the present invention, the end parts S1 and S2 of the wafer support parts 2a and 3a and the end part S3 of the wafer support part 4a are constituted to be located at positions of 65% or more and 75% or less of a radius of the wafer W from the center of the wafer W. Further, positions of supporting points of the lower surface of the wafer W by the end parts S1, S2 and S3 are arranged at intervals of 120° along a circumference of the wafer W.

Since the end parts S1, S2 and S3 are arranged at the above-described positions, a generated stress can be reduced as much as possible. As a result, an occurrence of a slip of the wafer can be suppressed.

Further, in the present invention, a horizontally sectional area Sa of the wafer support parts 2a and 3a including the support post parts 2b and 3b illustrated in (a) of FIG. 5 is substantially equal to a horizontally sectional area Sb of the wafer support part 4a including the support post part 4b illustrated in (b) of FIG. 5 and the absolute value of a ratio thereof is made to be 1% or smaller. That is, the absolute value of a Ratio defined by the following expression is 1% or lower.

$$\text{Ratio}(\%) = 100 \times (Sa - Sb)/(Sa + Sb)$$

In the above Sa, when the horizontally sectional area of the wafer support part 2a including the support post part 2b is denoted as Sa1 and the horizontally sectional area of the wafer support part 3a including the support post part 3b is denoted as Sa2, Sa1 is substantially equal to Sa2 and the absolute value of a Ratio defined similarly to the above expression is 1% or lower. That is, "Sa is substantially equal to Sb" as described above means that Sa1 is substantially equal to Sb and Sa2 is substantially equal to Sb, and the absolute value of ratios thereof is made to be 1% or smaller.

The thickness of the wafer support parts 2a, 3a and 4a is made to be the same. Thus, since the volume of the support members 2 and 3 is equal to the volume of the support member 4, a heat quantity that the support members 2 and 3 receive during a heat treatment is substantially equal to a heat quantity that the support member 4 receives during a heat treatment, so that there is no difference in deformation due to a thermal expansion. Accordingly, since the wafer W is held without being inclined, a stress is not concentrated on a specific part of the wafer W and the occurrence of a slip is suppressed.

(a) of FIG. 6 is a side view illustrating the support members 2 and 3 partly enlarged. (b) of FIG. 6 is a side view illustrating the support member 4 partly enlarged.

In the present embodiment, as illustrated in (a) and (b) of FIG. 6, upper surfaces of the wafer support parts 2a, 3a and 4a are flat and substantially entire parts thereof come into contact with a back surface of the wafer W. A difference in areas that the wafer support parts 2a and 3a and the wafer support part 4a come into contact with the wafer W is set to 30 mm$^2$ or smaller. Thus, a difference of an influence of heat transfer from the wafer support parts 2a, 3a and 4a to the wafer W is suppressed to be small.

As illustrated in (a) and (b) of FIG. 7 as a modified example of the present invention, in end parts of upper surface sides of the wafer support parts 2a, 3a and 4a, protruding parts 2a1, 3a1 and 4a1 that support the wafer W may be provided. In that case, contact areas with the wafer W in each of the protruding parts are made to be equal. By providing the protruding parts as described above, the influence of the heat transfer to the wafer W from the wafer support parts 2a, 3a and 4a can be made to be smaller.

As described above, according to the embodiment of the present invention, the horizontally sectional area of the wafer support parts 2a and 3a including the support post parts 2b and 3b is substantially equal to the horizontally sectional area of the wafer support part 4a including the support post part 4b, and the absolute value of the ratio thereof is made to be 1% or smaller. Thus, the heat quantity that the support members 2 and 3 receive during the heat treatment is substantially equal to the heat quantity that the support member 4 receives during the heat treatment, so that there is no difference in deformation due to the thermal expansion. Accordingly, since the wafer W is held without being inclined, the stress is not concentrated on the specific part of the wafer W and the occurrence of a slip can be suppressed.

Examples

The vertical wafer boat according to the present invention will be further described below by referring to Examples. In the present Examples, the vertical wafer boat shown in the embodiment is manufactured. The obtained wafer boat is used to carry out a heat treatment of the wafer. Thus, a performance of the wafer was inspected.

As different conditions for each of the Examples, only the size of the sectional area Sb was changed in such a way that the ratio of the horizontally sectional area Sa (see (a) of FIG. 5) of the wafer support parts 2a and 3a including the support post parts 2b and 3b of the wafer insert starting end side illustrated in FIG. 5 and the horizontally sectional area Sb (see (b) of FIG. 5) of the wafer support part 4a including the support post part 4b of the wafer insert terminal end side was different.

The above-described ratio was obtained by an expression: ratio (%)=100× (Sa−Sb)/(Sa+Sb)

A furnace used in the experiment is a vertical furnace for a diameter of 300 mm, having a size of an inside diameter of a furnace core pipe of 390 mm× a height of the furnace core pipe of 1650 mm. The outer form of a used vertical wafer boat has a size of diameters of a top plate and a bottom plate of 330 mm× a height of the boat of 1200 mm.

As the experiment using this furnace, each of the vertical wafer boats were subjected to heat treatment for ten times continuously under the same using conditions, and then one wafer for an evaluation was arranged on a central part of the boat (a 50$^{th}$ groove in a groove position from an upper part of the boat) and subjected to a heat treatment for the evaluation.

As a using condition, the vertical wafer boat on which 100 wafers were mounted was put in the furnace at 600° C., the temperature was raised to 1200° C., followed by holding for one hour, the temperature was lowered to 600° C., and then the vertical wafer boat was taken out. As the heat treatment for the evaluation, the vertical wafer boat was put in the furnace at 600° C., the temperature was raised to 1200° C., followed by holding for ten hours, the temperature was lowered to 600° C., and then the vertical wafer boat was taken out from the furnace. As a gas in both the cases, 100% of argon gas was supplied in an amount of 15 liter per minute in all processes.

In an evaluation of a slip, 100 silicon wafers of 12 inches which were mirror finished were mounted on the vertical wafer boat and subjected to the heat treatment once under the above-described using condition, and planes of three wafers of a first, a 50th and a 100th wafers were measured by an X-ray topography and the largest slip lengths that is the longest among observed slips were compared to perform the evaluation.

As for the judgement indicators for evaluation of a slip, the Examples were classified into three divisions and ranked by such indicators of "X" in the case where the largest slip length exceeded 30 mm, "Δ" in the case where the largest slip length was smaller than 30 mm and 10 mm or larger, and "○" in the case where the largest slip length was smaller than 10 mm or the slip itself was not present.

Table 1 shows conditions of the Examples 1 to 10 and results thereof.

TABLE 1

| | Ratio of horizontal sectional area of support members | Evaluation of slip |
|---|---|---|
| Example 1 | −30% | x |
| Example 2 | −20% | x |
| Example 3 | −10% | Δ |
| Example 4 | −5% | Δ |
| Example 5 | −1% | ○ |
| Example 6 | 0% | ○ |
| Example 7 | 1% | ○ |
| Example 8 | 5% | Δ |
| Example 9 | 10% | Δ |
| Example 10 | 20% | x |

As shown in the Table 1, in the case where an absolute value of the area ratio was within 1%, the largest slip length was smaller than 10 mm or the slip itself was not present.

Thus, it may be considered that in the case where the absolute value of the ratio of the sectional area Sa of the wafer support parts including the support post parts of the wafer insert starting end side and the sectional area Sb of the wafer support part including the support post part of the wafer insert terminal end side was within 1%, there was no difference in the heat quantity held between the wafer support members (namely, the difference of the thermal expansion can be suppressed to be low), the wafer can be held without being inclined and the slip caused by a distortion of the wafer due to the inclination can be suppressed.

While the present invention has been described in detail and with reference to specific embodiments thereof, it will be apparent to one skilled in the art that various changes and modifications can be made therein without departing from the spirit and scope of the present invention.

The present application is based on a Japanese patent application No. 2017-030224 filed on Feb. 21, 2017, the whole thereof being incorporated herein by reference.

DESCRIPTION OF REFERENCE NUMERALS AND SIGNS 1 wafer boat
2 support member
2a wafer support part (first wafer support part)
2b support post part (support post)

3 support member
3*a* wafer support part (second wafer support part)
3*b* support post part (support post)
4 support member
4*a* wafer support part (third wafer support part)
4*b* support post part (support post)
6 bottom plate
7 top plate

The invention claimed is:

1. A vertical wafer boat, to which a wafer is inserted in a wafer inserting direction, the vertical wafer boat comprising a top plate, a bottom plate, three support posts each having one end fixed to the top plate and the other end fixed to the bottom plate, and wafer support parts, wherein:
   the support posts comprise a first and a second support posts arranged in right and left sides of a starting end side of the wafer inserting direction, and a third support post arranged in a center of a terminal end side of the wafer inserting direction;
   the wafer support parts comprise a first, a second and a third wafer support parts protruding in the horizontal direction from side surfaces of the first, the second and the third support posts, respectively; and
   when a total of horizontal sectional areas of the first wafer support part and the first support post and a total of horizontal sectional areas of the second wafer support part and the second support post are denoted by Sa, and a total of horizontal sectional areas of the third wafer support part and the third support post is denoted by Sb, an absolute value of a Ratio defined by the following expression is 1% or lower:

$$\text{Ratio}(\%) = 100 \times (Sa - Sb)/(Sa + Sb).$$

2. The vertical wafer boat according to claim 1, wherein:
   the first wafer support part and the first support post form a bent leg shape in a horizontal section;
   the second wafer support part and the second support post form a bent leg shape in a horizontal section; and
   the third wafer support part and the third support post form a tapered shape in a horizontal section having a width increasing from an end of the third wafer support part toward a side of the third support post.

3. The vertical wafer boat according to claim 1, wherein end parts of the first, the second and the third wafer support parts are arranged to be in positions of 65% or more and 75% or less of a radius of the wafer to be supported, from a center of the wafer.

4. The vertical wafer boat according to claim 2, wherein end parts of the first, the second and the third wafer support parts are arranged to be in positions of 65% or more and 75% or less of a radius of the wafer to be supported, from a center of the wafer.

* * * * *